United States Patent
Kim et al.

(10) Patent No.: US 12,310,236 B2
(45) Date of Patent: May 20, 2025

(54) ENCAPSULANT PREVENTING LEAD LEAKAGE ON PEROVSKITE, METHOD FOR ENCAPSULATING PEROVSKITE TO PREVENT LEAD LEAKAGE AND PEROVSKITE PHOTOSENSITIVE DEVICE COMPRISING THE SAME

(71) Applicant: PUKYONG NATIONAL UNIVERSITY INDUSTRY—UNIVERSITY COOPERATION FOUNDATION, Busan (KR)

(72) Inventors: Junghwan Kim, Busan (KR); Na Hyun Kim, Changwon (KR); Su Min Oh, Daegu (KR); Hyeon Kwang Kim, Busan (KR); Sung Heum Park, Busan (KR)

(73) Assignee: PUKYONG NATIONAL UNIVERSITY INDUSTRY—UNIVERSITY COOPERATION FOUNDATION, Busan (KR)

( * ) Notice: Subject to any disclaimer, the term of this patent is extended or adjusted under 35 U.S.C. 154(b) by 7 days.

(21) Appl. No.: 18/355,976

(22) Filed: Jul. 20, 2023

(65) Prior Publication Data

US 2024/0032423 A1 Jan. 25, 2024

(51) Int. Cl.
| | |
|---|---|
| *H10K 85/60* | (2023.01) |
| *H10K 30/50* | (2023.01) |
| *H10K 30/88* | (2023.01) |

(52) U.S. Cl.
CPC ......... *H10K 85/6574* (2023.02); *H10K 30/50* (2023.02); *H10K 30/88* (2023.02)

(58) Field of Classification Search
None
See application file for complete search history.

(56) References Cited

U.S. PATENT DOCUMENTS

2021/0226251 A1* 7/2021 Ji .................. H01M 10/0569

FOREIGN PATENT DOCUMENTS

| EP | 3940806 A1 * | 1/2022 | .......... H10K 30/151 |
| KR | 20150125618 | 11/2015 | |

(Continued)

OTHER PUBLICATIONS

STN Structure search for U.S. Appl. No. 18/355,976 conducted by the Examiner for Chemical Formula 1, All Pages, 2024 (Year: 2024).*

(Continued)

*Primary Examiner* — Daniel P Malley, Jr.
(74) *Attorney, Agent, or Firm* — NORTON ROSE FULBRIGHT US LLP

(57) ABSTRACT

An encapsulant for encapsulating perovskite to prevent lead leakage therefrom, a method for encapsulating perovskite to prevent lead leakage therefrom, and a perovskite photoactive device including the encapsulant are disclosed. The encapsulant for encapsulating perovskite may contain a crown ether-based compound having a benzene ring substituted with an alkyl group. The perovskite encapsulating method may include coating, on a perovskite layer, a solution in which a crown ether-based compound having a benzene ring substituted with an alkyl group is dissolved in an organic solvent. The perovskite photoactive device includes an encapsulant encapsulating the perovskite layer to prevent the lead leakage therefrom.

10 Claims, 4 Drawing Sheets

Begin

Applying a solution onto a perovskite layer, wherein the solution is obtained by dissolving a crown ether-based compound in an organic solvent — S110

End

(56) References Cited

FOREIGN PATENT DOCUMENTS

KR  20150125618 A  * 11/2015
KR     101811243       1/2018

OTHER PUBLICATIONS

STN structure search for U.S. Appl. No. 18/355,976 conducted by the Examiner for Chemical Formula 1, All Pages, 2025. (Year: 2025).*
English machine translation of Lee (KR20150125618A) provided by the EPO website, All Pages, 2024 (Year: 2024).*

* cited by examiner

ENCAPSULANT PREVENTING LEAD LEAKAGE ON PEROVSKITE, METHOD FOR ENCAPSULATING PEROVSKITE TO PREVENT LEAD LEAKAGE AND PEROVSKITE PHOTOSENSITIVE DEVICE COMPRISING THE SAME

CROSS-REFERENCE TO RELATED APPLICATION

This application claims priority from Korean Patent Application No. 10-2022-0089245 filed on Jul. 20, 2022 in the Korean Intellectual Property Office, and all the benefits accruing therefrom under 35 U.S.C. 119, the contents of which in its entirety are herein incorporated by reference.

BACKGROUND

Field

The present disclosure relates to an encapsulant for encapsulating perovskite to prevent lead leakage therefrom, a method for encapsulating perovskite to prevent lead leakage therefrom, and a perovskite photoactive device including the encapsulant.

Description of Related Art

Organic/inorganic perovskite is in the limelight as an electronic material. However, perovskite containing lead has a lead component leakage problem. To prevent such leakage of the lead component, an encapsulant may be formed on perovskite.

When crown ether is used as the encapsulant, leakage of the lead is prevented via a chelate bond thereof to a lead element. When the encapsulant further contains a metal oxide, the encapsulant blocks external moisture and oxygen, thus contributing to device stability. However, it is difficult to form the encapsulant in a solution process because solubility of the crown ether is poor.

SUMMARY

One purpose of the present disclosure is to provide an encapsulant that encapsulates perovskite to prevent lead leakage therefrom, in which the encapsulant has high lead leakage prevention ability and high moisture and oxygen blocking ability, and may be easily formed in a solution process.

Another purpose of the present disclosure is to provide a method for encapsulating perovskite to prevent lead leakage therefrom, the method including forming the encapsulant encapsulating perovskite to prevent lead leakage therefrom.

Still another purpose of the present disclosure is to provide a perovskite photoactive device including the encapsulant.

A first aspect of the present disclosure provides an encapsulant for encapsulating perovskite to prevent lead leakage therefrom, the encapsulant including a crown ether-based compound represented by a following Chemical Formula (1):

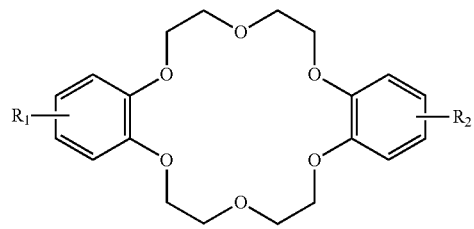

where each of $R_1$ and $R_2$ independently represents one selected from a group of alkyl groups.

In this regard, introducing the alkyl group as described above may allow the solubility of the crown ether-based compound to be improved.

In one implementation of the first aspect, each of $R_1$ and $R_2$ is tert-butyl.

In one implementation of the first aspect, the encapsulant further comprises a metal oxide.

In this regard, the metal oxide as described above may allow the encapsulant to block external moisture and oxygen.

In one implementation of the first aspect, the metal oxide includes titanium oxide ($TiO_x$).

In one implementation of the first aspect, a mass ratio of the crown ether-based compound and the titanium oxide is 1:1 or greater.

In one implementation of the first aspect, the mass ratio of the crown ether-based compound and the titanium oxide is in a range of 1:1 to 1:10.

Under the above defined mass ratio, the encapsulant according to the embodiment of the present disclosure may achieve an improved encapsulating effect.

A second aspect of the present disclosure provides a method for encapsulating perovskite to prevent lead leakage therefrom, the method comprising applying a solution onto a perovskite layer, wherein the solution is obtained by dissolving a crown ether-based compound represented by a following Chemical Formula (1) in an organic solvent:

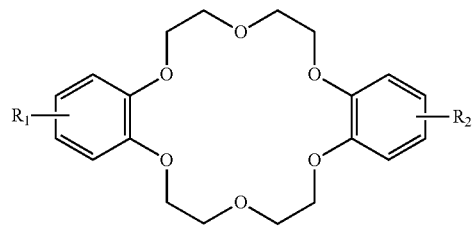

where each of $R_1$ and $R_2$ independently represents one selected from a group of alkyl groups.

In this regard, introducing an alkyl group as described above may facilitate a solution process in the perovskite encapsulating method according to an embodiment of the present disclosure.

In one implementation of the second aspect, each of $R_1$ and $R_2$ is tert-butyl.

In one implementation of the second aspect, the organic solvent includes at least one organic solvent selected from a group consisting of methanol, ethanol, isopropyl alcohol and butanol, isomers thereof, and combinations of at least two thereof.

In one implementation of the second aspect, a concentration of the crown ether-based compound in the solution is 0.01% by weight or greater.

In one implementation of the second aspect, a concentration of the crown ether-based compound in the solution is in a range of 0.01% to 3% by weight.

In one implementation of the second aspect, the solution further contains a metal oxide.

In this regard, the metal oxide as described above may allow the encapsulant formed by the method to block external moisture and oxygen.

In one implementation of the second aspect, the metal oxide includes titanium oxide ($TiO_x$).

In one implementation of the second aspect, a mass ratio of the crown ether-based compound and the titanium oxide is 1:1 or greater.

In one implementation of the second aspect, a concentration of the crown ether-based compound in the solution is in a range of 1% to 2% by weight, wherein the mass ratio of the crown ether-based compound and the titanium oxide is 1:5 or greater.

In one implementation of the second aspect, the concentration of the crown ether-based compound in the solution is in a range of 0.04% to 3% by weight.

Under the above defined mass ratio and concentration, the perovskite encapsulating method according to the embodiment of the present disclosure may achieve an improved encapsulating effect.

In one implementation of the second aspect, the solution is applied on the perovskite layer at 0.1 to 0.2 $\mu l/cm^2$. Thus, the encapsulating efficiency may be improved due to the application amount as described above.

In one implementation of the second aspect, the method further comprises, after applying the solution on the perovskite layer, performing heat treatment on the solution at 90 to 110° C. for 3 to 10 minutes.

The above additional step may allow the mechanical stability of the encapsulant to be secured.

A third aspect of the present disclosure provides an encapsulant for encapsulating perovskite to prevent lead leakage therefrom, wherein the encapsulant is formed on the perovskite layer using the method as described above.

A fourth aspect of the present disclosure provides a perovskite photoactive device comprising: a substrate; a first conductive layer formed on the substrate; a perovskite photoactive layer formed on the first conductive layer; a second conductive layer formed on the perovskite photoactive layer; an encapsulating layer formed on the second conductive layer, wherein the encapsulating layer includes the encapsulant as described above; and an electrode formed on the encapsulating layer.

The encapsulant for encapsulating the perovskite according to the embodiment of the present disclosure may realize improved encapsulating ability, thermal stability, and process easiness.

The solution process is easy in the perovskite encapsulating method according to the embodiment of the present disclosure. This may improve the encapsulating ability of the encapsulant.

The perovskite photoactive device according to the embodiment of the present disclosure may be disposed between the conductive layer and the electrode so as to provide the encapsulating effect.

Effects of the present disclosure are not limited to the above-mentioned effects, and other effects as not mentioned will be clearly understood by those skilled in the art from following descriptions.

DETAILED DESCRIPTIONS

Figure 1:
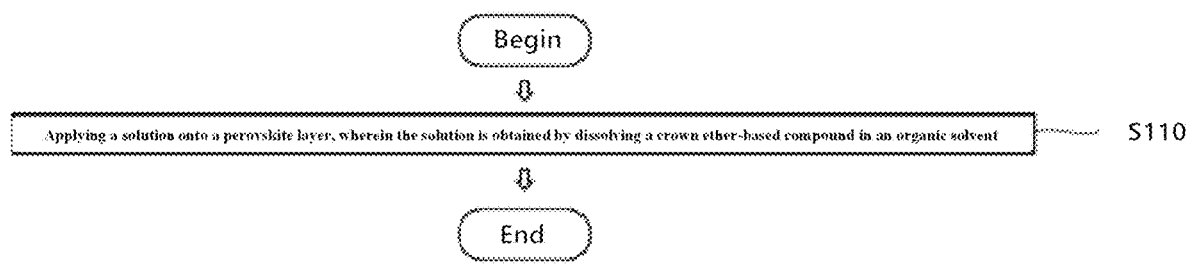
FIG. 1 is a flow chart illustrating a method for encapsulating perovskite to prevent lead leakage therefrom according to an embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for describing embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In descriptions of temporal relationships, for example, temporal precedent relationships between two events such as "after", "subsequent to", "before", etc., another event may occur therebetween unless "directly after", "directly subsequent" or "directly before" is not indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects," and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

An encapsulant for encapsulating perovskite to prevent lead leakage therefrom according to an embodiment of the present disclosure may include a crown ether-based compound. In one embodiment, the crown ether-based compound may be represented by a following Chemical Formula (1):

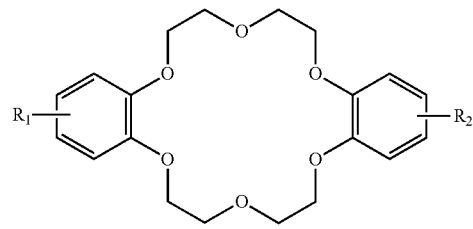

where each of $R_1$ and $R_2$ independently represents one selected from a group of alkyl groups. As used herein, an alkyl group means a functional group including only a carbon chain and hydrogens bonded thereto, or further including another functional group. Introducing the alkyl group as described above may allow the solubility of the crown ether-based compound to be improved. Moreover, due to the hydrophobicity of the alkyl group, the ability of the encapsulant to block external moisture may be improved. Therefore, as long as an alkyl group performs the above function, a type thereof is not particularly limited. Non-limiting examples of the alkyl group may include propyl, butyl, pentyl, hexyl, heptyl, octyl, structural isomers thereof, or combinations of two or more thereof. In one embodiment, each of $R_1$ and $R_2$ may be independently selected from a group of alkyl groups having 1 to 10, 3 to 10, 1 to 8 or 3 to 8 carbon atoms. In one embodiment, each of $R_1$ and $R_2$ may be tert-butyl.

In one embodiment, the encapsulant for encapsulating perovskite may further include a metal oxide. The metal oxide as described above may allow the encapsulant to block external moisture and oxygen. Therefore, as long as the metal oxide performs the above function, a type thereof is not particularly limited. In one embodiment, the metal oxide may include titanium oxide ($TiO_x$).

The mixing ratio of the crown ether-based compound and titanium oxide may be adjusted based on solution process easiness and the target purpose of the encapsulant. In one embodiment, the mass ratio of the crown ether-based compound and titanium oxide may be about 1:1 or greater. In one embodiment, the mass ratio of the crown ether-based compound and titanium oxide may be in a range of about 1:1 to about 1:10. Under the above mixing ratio, the encapsulant for encapsulating perovskite according to the embodiment of the present disclosure may achieve an improved encapsulating effect.

As described above, the encapsulant for encapsulating perovskite according to the embodiment of the present disclosure may realize improved encapsulating ability, thermal stability, and solution process easiness.

FIG. 1 is a flow diagram illustrating a method for encapsulating perovskite to prevent lead leakage therefrom according to an embodiment of the present disclosure.

Referring to FIG. 1, a method for encapsulating perovskite to prevent lead leakage therefrom according to an embodiment of the present disclosure includes applying a solution in which a crown ether-based compound is dissolved in an organic solvent onto a perovskite layer (S110). The applying step (S110) is a step of applying a compound having encapsulating ability on the perovskite layer in a solution process.

In one embodiment, the crown ether-based compound may have a following Chemical Formula (1).

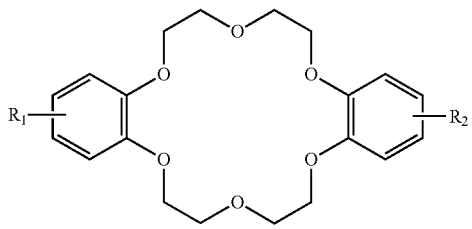

where each of $R_1$ and $R_2$ independently represents one selected from a group of alkyl groups. As used herein, an alkyl group means a functional group including only a carbon chain and hydrogens bonded thereto, or further including another functional group. When the alkyl group is introduced as described above, the solution process is easy in the perovskite encapsulating method according to the embodiment of the present disclosure. Moreover, due to the hydrophobicity of the alkyl group, the ability of the encapsulant to block external moisture may be improved. Therefore, as long as an alkyl group performs the above function, a type thereof is not particularly limited. Non-limiting examples of the alkyl group may include propyl, butyl, pentyl, hexyl, heptyl, octyl, structural isomers thereof, or combinations of two or more thereof. In one embodiment, each of $R_1$ and $R_2$ may be independently selected from a group of alkyl groups having 1 to 10, 3 to 10, 1 to 8 or 3 to 8 carbon atoms. In one embodiment, each of $R_1$ and $R_2$ may be tert-butyl.

The perovskite encapsulating method according to the embodiment of the present disclosure may include a solution process. Therefore, the crown ether-based compound may be dissolved in a solvent to produce the solution which in turn may be applied on the perovskite layer in the application step (S110).

As long as the solvent is capable of performing the above function, the solvent is not particularly limited. For example, the solvent may be an organic solvent. In one embodiment, the organic solvent may include, but is not limited to, at least one organic solvent selected from the group consisting of methanol, ethanol, isopropyl alcohol and butanol, isomers thereof, and combinations of two or more thereof.

In one example, the concentration, the thickness, the density, etc. at which the crown ether-based compound having the encapsulating ability is applied may be determined based on the concentration of the solution. Therefore, the concentration of the crown ether-based compound in the solution may be determined based on target encapsulating ability and efficiency. In one embodiment, the concentration of the crown ether-based compound in the solution may be greater than or equal to about 0.01% by weight. In one embodiment, the concentration of the crown ether-based compound in the solution may be in a range of about 0.01 to 3% by weight.

In one example, as described above, the solubility of the crown ether-based compound may be improved by introducing $R_1$ and $R_2$ independently selected from the group of alkyl groups into the crown ether-based compound. When $R_1$ and $R_2$ are not introduced thereto, the solubility of the crown ether-based compound may be low such that it is difficult for the concentration of the crown ether-based compound in the solution to reach a value greater than or equal to about 0.03% by weight. The present disclosure is based on the discovery that the encapsulating ability of the encapsulant may be increased by introducing a functional group including the alkyl group into the crown ether-based compound to significantly increase the concentration of the crown ether-based compound in the solution in the application process.

In one embodiment, the solution may further include a metal oxide. Due to the metal oxide as described above, the coated product may block external moisture and oxygen. Therefore, as long as the metal oxide performs the above function, a type thereof is not particularly limited. In one embodiment, the metal oxide may include titanium oxide ($TiO_x$).

The mixing ratio of the crown ether-based compound and titanium oxide may be adjusted based on process easiness and a target performance of the encapsulant. In one embodiment, the mass ratio of the crown ether-based compound and titanium oxide may be about 1:1 or greater. In one embodiment, the mass ratio of the crown ether-based compound and titanium oxide may be in a range of about 1:1 to about 1:10. Under the above mixing ratio, the method for encapsulating the perovskite according to the embodiment of the present disclosure may achieve an improved encapsulating effect.

In one example, the concentration of the crown ether-based compound in the solution and the mass ratio of the crown ether-based compound and titanium oxide may be determined based on the target encapsulating performance. In one embodiment, the concentration of the crown ether-based compound in the solution may be in a range of about 1 to 2% by weight, and the mass ratio of the crown ether-based compound and titanium oxide may be about 1:5 or greater. In one embodiment, the concentration of the crown ether-based compound in the solution may be in a range of about 0.01 to about 0.03% by weight. In one embodiment, the mass ratio of the crown ether-based compound and the titanium oxide may be in a range of about 1:4 to about 1:6. In one embodiment, the concentration of the crown ether-based compound in the solution may be in a range of about 0.01 to about 0.03% by weight, and the mass ratio of the crown ether-based compound and titanium oxide may be in a range of about 1:4 to 1:6. In one embodiment, the concentration of the crown ether-based compound in the solution may be in a range of about 0.04 to 3% by weight. Under the above-defined mixing ratio and concentration, the perovskite encapsulating method according to the embodiment of the present disclosure may achieve an improved encapsulating effect.

The perovskite encapsulating method according to the embodiment of the present disclosure is performed in a solution process (S110) in which the solution is applied onto the perovskite layer. Thus, the thickness, the density, and the encapsulating ability of the encapsulant may be determined based on an amount of application of the solution. Therefore, the application amount of the solution may be determined based on the target encapsulating ability. In one embodiment, the solution may be applied on the perovskite layer at about 0.1 to 0.2 µl/cm$^2$.

The perovskite encapsulating method according to the embodiment of the present disclosure does not exclude an additional process to improve the encapsulating ability. In one embodiment, the method for encapsulating perovskite to prevent lead leakage therefrom may further include heat treatment on the solution at about 90 to 110° C. for about 3 to 10 minutes after applying the solution on the perovskite layer. Via the above additional process, the mechanical stability of the encapsulant may be secured.

As described above, the solution process is easy in the perovskite encapsulating method according to the embodiment of the present disclosure. The method achieves improved encapsulating ability.

In one example, the encapsulant for encapsulating perovskite to prevent lead leakage therefrom according to an embodiment of the present disclosure as described above may be formed on the perovskite layer using the method for encapsulating perovskite to prevent lead leakage therefrom as described above.

Figure 2:
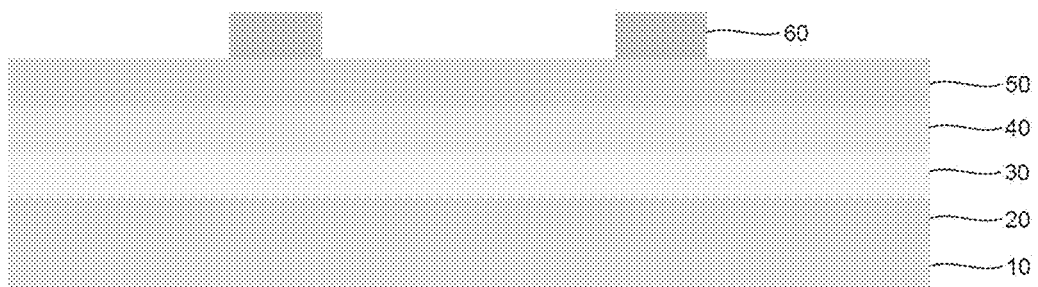
FIG. 2 is a schematic diagram showing a perovskite photoactive device according to an embodiment of the present disclosure.

FIG. 2 shows a schematic diagram of a perovskite photoactive device according to an embodiment of the present disclosure.

Referring to FIG. 2, a perovskite photoactive device according to an embodiment of the present disclosure includes a substrate 10; a first conductive layer 20 formed on the substrate 10; a perovskite photoactive layer 30 formed on the first conductive layer 20; a second conductive layer 40 formed on the perovskite photoactive layer 30; an encapsulating layer 50 formed on the second conductive layer 40, wherein the encapsulating layer 50 includes the encapsulant encapsulating perovskite to prevent the lead leakage; and an electrode 60 formed on the encapsulating layer 50.

The substrate 10 may be a support member on which other functional layers included in the perovskite photoactive device are formed, and may have conductivity. The material of the substrate 10 is not particularly limited as long as the substrate performs the above-described function. In particular, when the substrate has conductivity, the substrate may include indium tin oxide (ITO).

The perovskite photoactive layer 30 may include a material having a perovskite structure and may be a photoactive member. As used herein, "photoactive" means a property of a material that the material exhibits physical or chemical performance as light is incident thereon. In one example, the material exhibits electrical properties as light is incident thereon. In one embodiment, the perovskite photoactive layer 30 exhibits electrical properties when light is incident thereon, so that an electric potential may be generated in the conductive member adjacent thereto. The material of the perovskite photoactive layer 30 is not particularly limited as long as the material has the above structure and performs the above function.

The first conductive layer 20 and the second conductive layer 40 are conductive members capable of conducting electrons or holes due to the potential therein generated under photoactivation of the perovskite photoactive layer 30. The material of each of the first conductive layer 20 and the second conductive layer 40 is not particularly limited as long the material performs the above-described function. Non-limiting examples thereof may include poly(3,4-ethylenedioxythiophene) polystyrene sulfonate (PEDOT:PSS), nickel oxide, poly(triaryl amine) (PTAA), and [6,6]-phenyl-C61-butyric acid methyl ester (PCBM).

The encapsulating layer 50 may include the encapsulant for encapsulating the perovskite according to an embodiment of the present disclosure. In one example, the electrode is formed on top of the encapsulating layer 50 and is connected in series or parallel with another conductive member to implement a perovskite photoactive device according to an embodiment of the present disclosure in an electric device.

As may be identified based on a relative position of the encapsulating layer 50 and the electrode 60 in FIG. 2 that even when the encapsulating layer 50 including the encapsulant for encapsulating perovskite according to the embodiment of the present disclosure is disposed between the electrode 60 and the second conductive layer 40, the perovskite photoactive device according to the present disclosure may maintain its function because the encapsulating layer is conductive. Therefore, unlike a conventional scheme in which the second conductive layer is in direct contact with the electrode, and both the second conductive layer and the electrode are encapsulated with an encapsulating layer, the encapsulant according to the embodiment of the present disclosure may be formed between the second conductive layer and the electrode and may replace the conventional encapsulant. Further, a conventional encapsulant including epoxy may be formed on the electrode to further improve the encapsulating ability.

In one embodiment, the perovskite photoactive device according to the embodiment of the present disclosure may further include a second encapsulating layer formed on the electrode 60 and the encapsulating layer 50. The second encapsulating layer may optionally include epoxy.

As described above, in the perovskite photoactive device according to the embodiment of the present disclosure, the encapsulating layer having the encapsulating effect may be formed between the conductive layer and the electrode.

Hereinafter, various examples and experimental examples of the present disclosure will be described in detail. However, the following examples are merely some examples of the present disclosure, and the present disclosure should not be construed as being limited to the following examples.

Preparation of Application Solution

We prepared a coating solution for performing the perovskite encapsulating method. 18-crown-6-ether (hereafter, referred to as a raw material) was prepared as the crown ether. A compound (hereinafter, referred to as di-benzo) in which only two benzene rings are bonded to the crown ether was prepared as a comparative group. A compound (hereinafter, referred to as di-tert) in which a tert-butyl group was bonded to each benzene ring was prepared as an encapsulating material according to the embodiment. The di-benzo was dissolved in ethanol at 0.01 to 0.03% by weight. The di-tert was dissolved in ethanol at each of 0.01 to 0.04% by weight, 0.1% by weight, 1% by weight, and 3% by weight. Thus, resulting solutions were prepared. Further, a solution (hereinafter, referred to as di-tert+TiO$_x$) in which the di-tert and titanium oxide were dissolved in ethanol was additionally prepared. The mass ratios of di-tert and titanium oxide were 1:1, 1:5, and 1:10, respectively.

Applying and Encapsulating Process

A 25 cm×25 cm glass substrate was prepared. A perovskite layer made of MAPbI$_3$ was formed on the glass substrate. 100 µl of each of the coating solutions was applied on the formed perovskite layer in a spin coating manner. Thereafter, heat treatment was performed thereon at 100 degrees C. for 5 minutes.

Solvent Solubility and Melting Point Measurement

The melting point of the raw material was measured as 37 to 40° C. This melting point cannot be used for solar cells. The melting point of di-benzo was measured as 160° C. The melting point of di-tert was slightly lowered, but was still maintained at a value above 110° C. This melting point may be used for use in solar cells. In one example, the di-benzo had low solvent solubility, and could not be dissolved in the solvent by more than 0.03% by weight, whereas the di-tert had improved solvent solubility due to the alkyl group added thereto. Thus, it may be identified that the di-tert is most suitable as a material of the encapsulant for encapsulating the perovskite in terms of thermal stability and process easiness at the same time.

Identification of Lead Leakage

In order to identify the amount of lead leakage from the perovskite (hereinafter referred to as perovskite) that has not undergone the encapsulating process, and the lead leakage amount when using the di-benzo and when using the di-tert at each concentration, each sample was placed in 40 mL of water for 30 seconds or 15 minutes, and each water was taken and analyzed and photographed with ICPMS (Inductively Coupled Plasma Mass Spectrometry). FIGS. 3 to 7 show the results.

Figure 3:
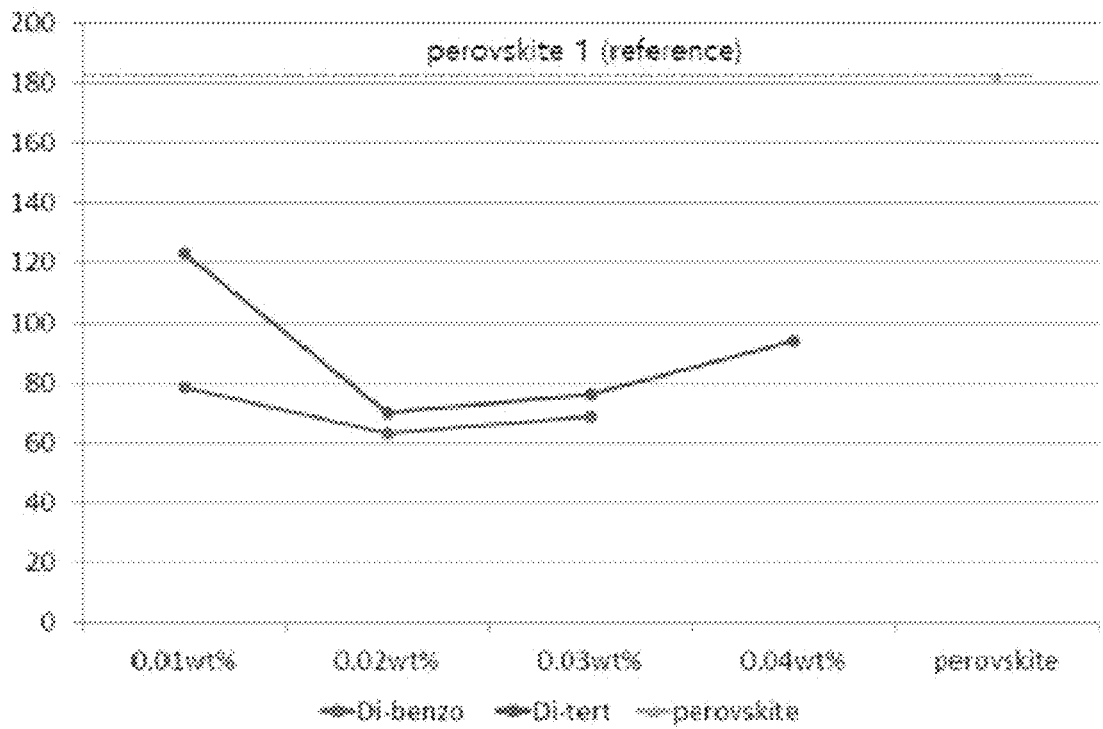
FIGS. 3 to 7 are graphs and photographs showing experimental results according to experimental examples of the present disclosure.

FIG. 3 is a graph analyzing the lead leakage amount for 30 seconds after encapsulating the perovskite only with di-tert without $TiO_x$ Referring to FIG. 3, both di-benzo and di-tert exhibit the lead leakage amount lower than that of the perovskite. Thus, it may be identified that encapsulating the perovskite using each of di-benzo and di-tert has an encapsulating effect. It may be identified that di-benzo has slightly better encapsulating effect than di-tert has, and both samples exhibit the best encapsulating effect at 0.02% by weight.

Figure 4:
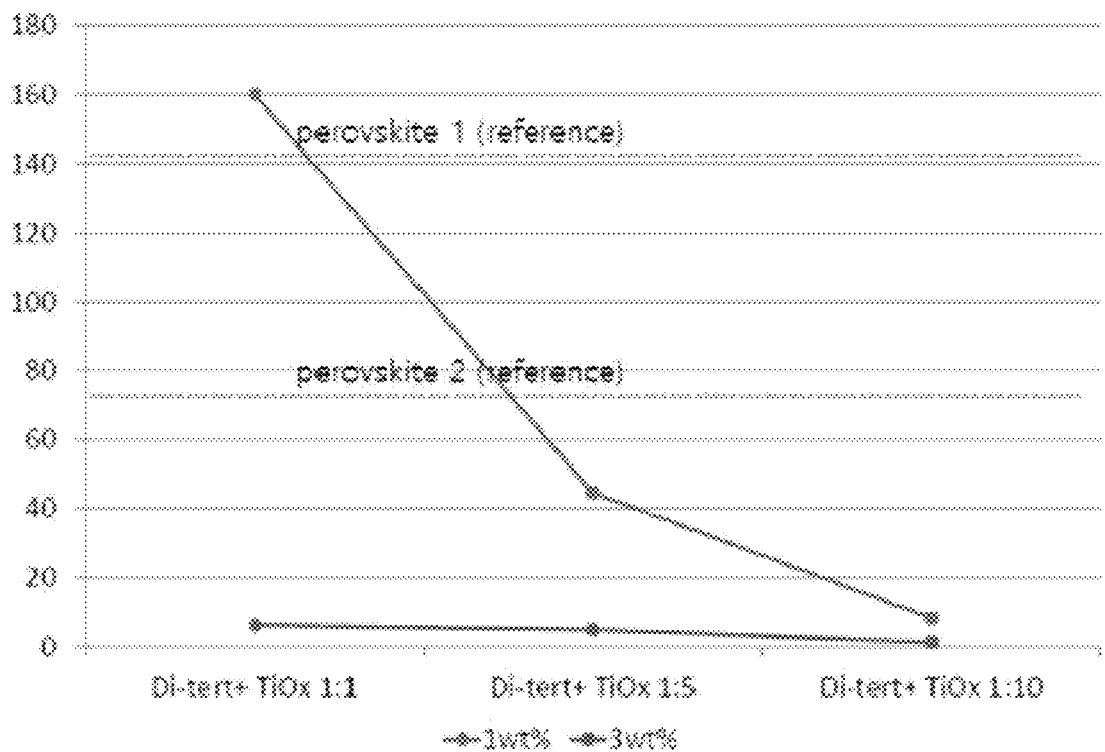

FIG. 4 is a graph analyzing the lead leakage amount for 30 seconds after encapsulating the perovskite with an encapsulating material having different contents of $TiO_x$ at a high concentration di-tert. Referring to FIG. 4, it is identified when the di-tert concentration is relatively high (1 wt % and 3 wt %), the amount of lead leakage is small when the mass ratio of di-tert and TiOx is high. This confirms that $TiO_x$ is effective in preventing the lead leakage under a certain condition. In particular, it may be identified that when the content of di-tert is 1% by weight, and the mass ratio of di-tert and TiOx is 1:5 or greater, and high encapsulating ability is achieved.

Figure 5:
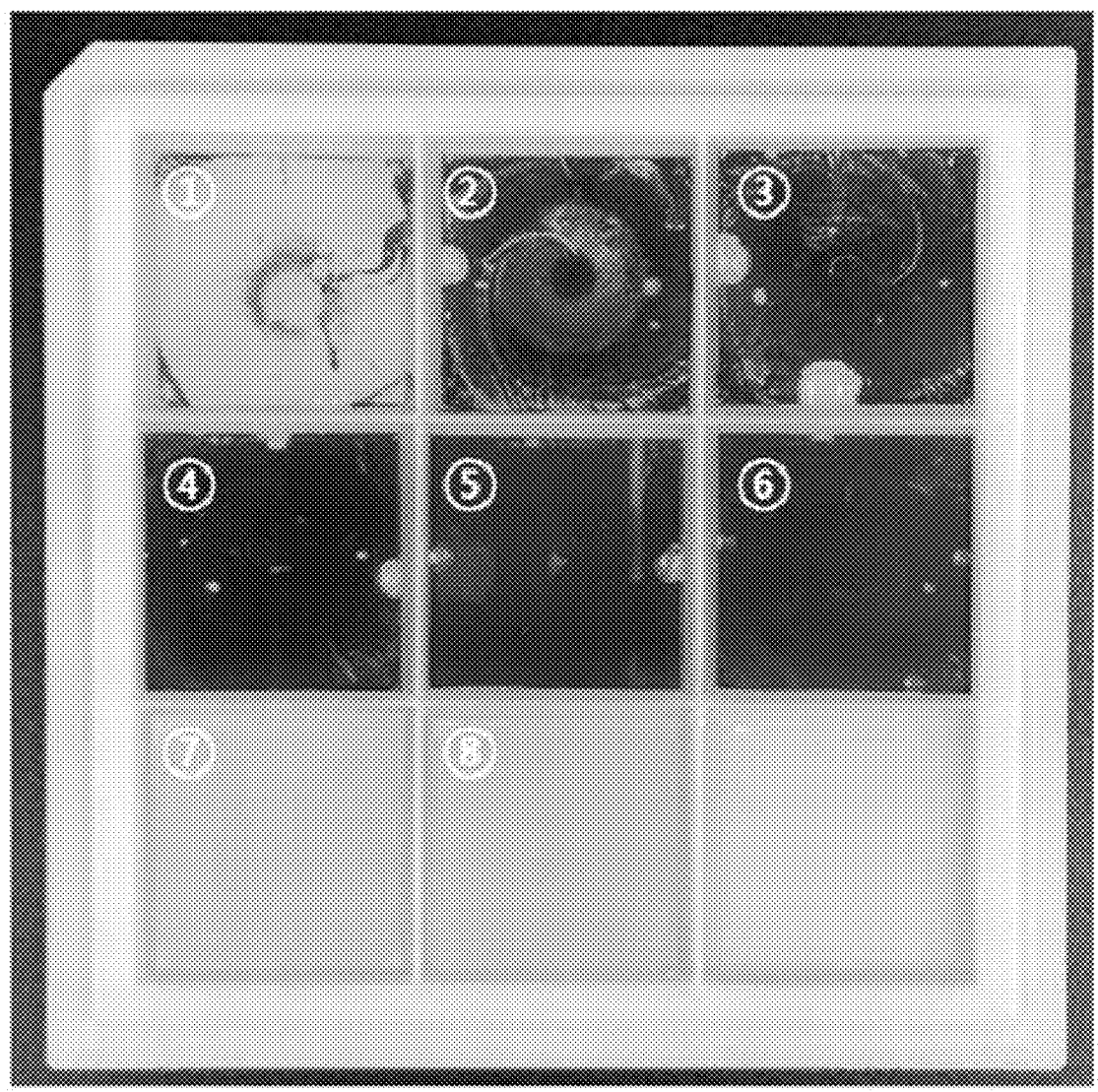

FIG. 5 is a photograph of each sample. In FIG. 5, ① is related to an example of di-tert 1% by weight, and the mass ratio of di-tert and $TiO_x$ being 1:1, ② is related to an example of di-tert 1% by weight, and the mass ratio of di-tert and $TiO_x$ being 1:5, ③ is related to an example of 1 weight %, and the mass ratio of di-tert and $TiO_x$ being 1:10, ④ is related to an example of di-tert 3% by weight of di-tert, and the mass ratio of di-tert and $TiO_x$ being 1:1, ⑤ is related to an example of di-tert 3% by weight of di-tert, and the mass ratio of di-tert and $TiO_x$ being 1:5, ⑥ is related to an example of di-tert 3% by weight, and the mass ratio of di-tert to $TiO_x$ being 1:10, and ⑦ and ⑧ are related to the perovskite control group.

Figure 6:
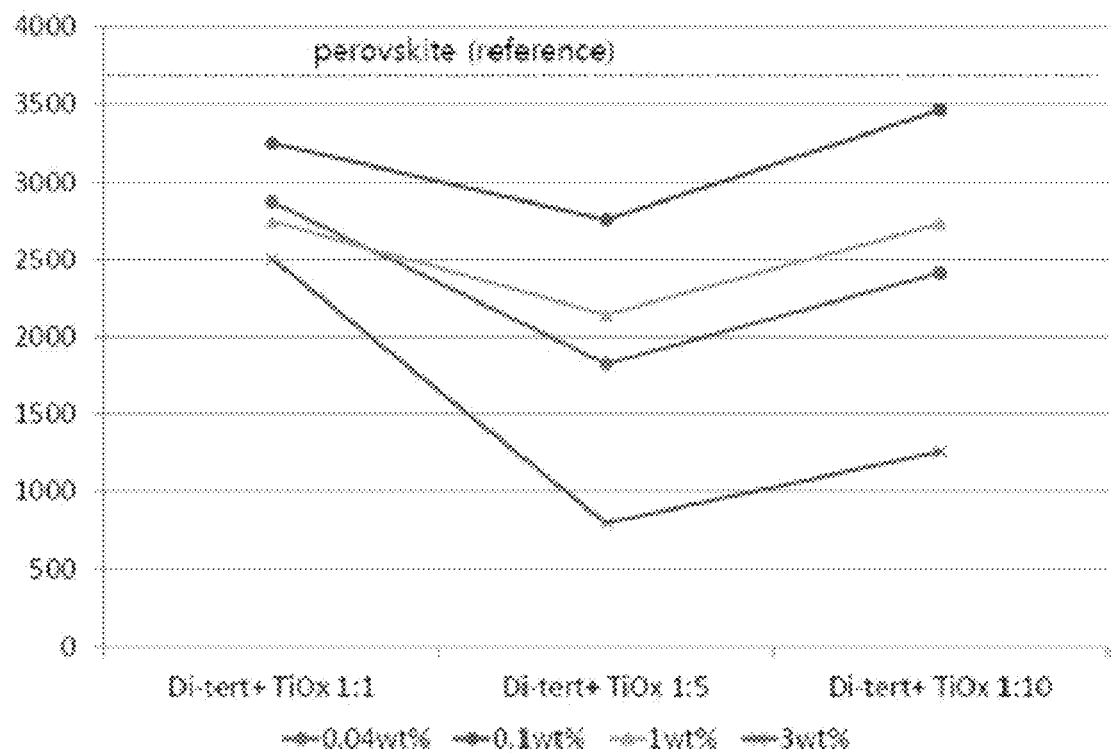

FIG. 6 is a graph analyzing the amount of the lead leakage for 15 minutes after encapsulating the perovskite layer. Referring to FIG. 6, it may be identified that when being placed in water for a relatively long time, the amounts of lead leakage at all di-tert and $TiO_x$ mass ratios and all di-tert concentrations are smaller than that in the perovskite. Moreover, it may be identified that when the mass ratio of di-tert to $TiO_x$ is 1:5, the lead leakage amount has a minimum value at all di-tert concentrations. Thus, it may be identified that the mixture of di-tert and $TiO_x$ have a synergistic effect in terms of suppressing the amount of lead leakage when di-tert and $TiO_x$ are mixed with each other in an appropriate ratio of about 1:5.

Figure 7:
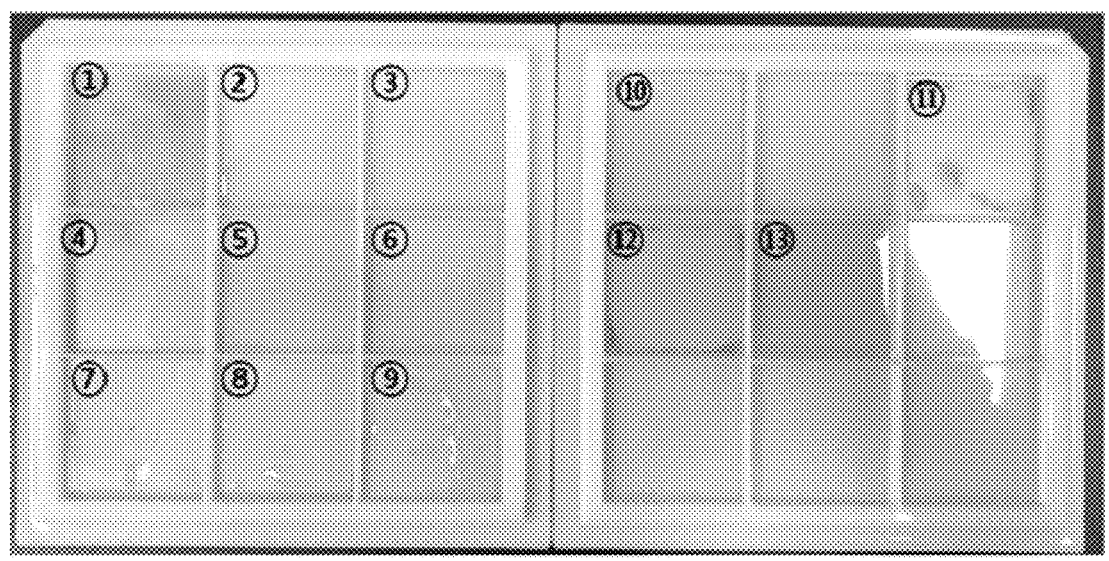

FIG. 7 is a photograph of each sample. In FIG. 7, ① is related to an example of di-tert 0.04 wt %, and the mass ratio of di-tert and $TiO_x$ being 1:1, ② is related to an example of di-tert 0.04 wt %, and the mass ratio of di-tert and $TiO_x$ being 1:5, ③ is related to an example of di-tert 0.04 wt % %, and the mass ratio of di-tert and $TiO_x$ being 1:10, ④ is related to an example of di-tert 0.1% by weight, and a the mass ratio of di-tert and $TiO_x$ being 1:1, ⑤ is related to an example of di-tert 0.1% by weight, and the mass ratio of di-tert and $TiO_x$ being 1:5, ⑥ is related to an example of di-tert 0.1% by weight, and the mass ratio of di-tert and $TiO_x$ being 1:10, ⑦ is related to an example of di-tert 1% by weight and the mass ratio of di-tert and $TiO_x$ being 1:1, ⑧ is related to an example of di-tert 1% by weight, and the mass ratio of di-tert and $TiO_x$ being 1:5, ⑨ is related to an example of di-tert 1% by weight, and the mass ratio of di-tert and $TiO_x$ being 1:10, ⑩ is related to an example of di-tert 3% by weight, and the mass ratio of di-tert and $TiO_x$ being 1:1, ⑪ is related to an example of di-tert 3% by weight, and the mass ratio of di-tert and $TiO_x$ being 1:5, ⑫ is related to an example of di-tert 3% by weight, and the mass ratio of di-tert and $TiO_x$ being 1:10, and ⑬ is related to the perovskite control group.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

What is claimed is:

1. An encapsulant comprising a crown ether-based compound represented by a following Chemical Formula (1):

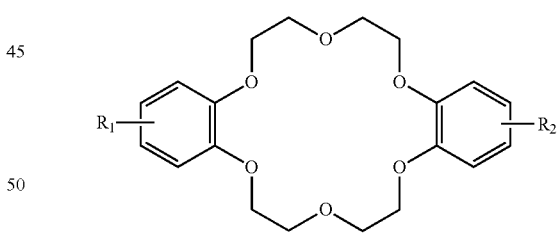

wherein each of $R_1$ and $R_2$ is tert-butyl, wherein the encapsulant further comprises a metal oxide that includes titanium oxide ($TiO_x$), wherein a mass ratio of the crown ether-based compound and the titanium oxide is 1:1 or greater, and wherein the encapsulant is capable of encapsulating perovskite to (i) prevent lead leakage from the perovskite and (ii) prevent moisture and oxygen infiltration into the perovskite.

2. The encapsulant of claim 1, wherein the mass ratio of the crown ether-based compound and the titanium oxide is in a range of 1:1 to 1:10.

3. A method for encapsulating perovskite to prevent lead leakage therefrom, the method comprising applying a solution onto a perovskite layer, wherein the solution is obtained by dissolving a crown ether-based compound represented by a following Chemical Formula (1) in an organic solvent:

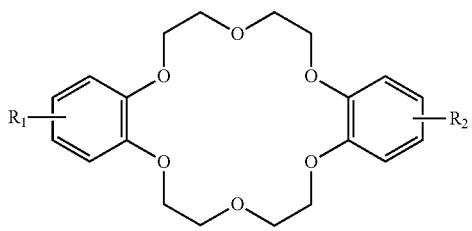

wherein each of $R_1$ and $R_2$ independently represents one selected from a group of alkyl groups, and where the encapsulant (i) prevents lead leakage from the perovskite and (ii) prevents moisture and oxygen infiltration into the perovskite, wherein the organic solvent includes at least one organic solvent selected from methanol, ethanol, isopropyl alcohol, or butanol, isomers thereof, or combinations of at least two thereof, wherein a concentration of the crown ether-based compound in the solution is in a range of 0.01% to 3% by weight, wherein the solution further contains a metal oxide that includes titanium oxide (TiOx), and wherein a mass ratio of the crown ether-based compound and the titanium oxide is 1:1 or greater.

4. The method of claim 3, wherein each of $R_1$ and $R_2$ is tert-butyl.

5. The method of claim 3, wherein the concentration of the crown ether-based compound in the solution is in a range of 1% to 2% by weight,
wherein the mass ratio of the crown ether-based compound and the titanium oxide is 1:5 or greater.

6. The method of claim 3, wherein the concentration of the crown ether-based compound in the solution is in a range of 0.04% to 3% by weight.

7. The method of claim 3, wherein the solution is applied on the perovskite layer in an amount of 0.1 to 0.2 µl/cm².

8. The method of claim 3, wherein the method further comprises, after applying the solution on the perovskite layer, performing heat treatment on the solution at 90 to 110° C. for 3 to 10 minutes.

9. A perovskite that is encapsulated by the encapsulant of claim 1.

10. A perovskite photoactive device comprising:
a substrate;
a first conductive layer formed on the substrate;
a perovskite photoactive layer formed on the first conductive layer;
a second conductive layer formed on the perovskite photoactive layer;
an encapsulating layer formed on the second conductive layer, wherein the encapsulating layer includes the encapsulant of claim 1; and
an electrode formed on the encapsulating layer.

* * * * *